(12) United States Patent
Ota et al.

(10) Patent No.: US 9,306,147 B2
(45) Date of Patent: Apr. 5, 2016

(54) METHOD OF PRODUCING SUBSTRATE AND SUPERCONDUCTING WIRE

(75) Inventors: Hajime Ota, Osaka (JP); Masaya Konishi, Osaka (JP); Takashi Yamaguchi, Osaka (JP)

(73) Assignees: SUMITOMO ELECTRIC INDUSTRIES, LTD., Osaka-shi, Osaka (JP); TOYO KOHAN CO., LTD., Tokyo (JP)

(*) Notice: Subject to any disclaimer, the term of this patent is extended or adjusted under 35 U.S.C. 154(b) by 448 days.

(21) Appl. No.: 13/381,191

(22) PCT Filed: Jun. 15, 2010

(86) PCT No.: PCT/JP2010/060102
§ 371 (c)(1),
(2), (4) Date: Dec. 28, 2011

(87) PCT Pub. No.: WO2011/004684
PCT Pub. Date: Jan. 13, 2011

(65) Prior Publication Data
US 2012/0108439 A1 May 3, 2012

(30) Foreign Application Priority Data
Jul. 10, 2009 (JP) ................................. 2009-163513

(51) Int. Cl.
*H01L 39/24* (2006.01)

(52) U.S. Cl.
CPC .................................. *H01L 39/2461* (2013.01)

(58) Field of Classification Search
CPC ..................................................... H01L 39/2461
USPC .................................... 505/434; 427/327, 328
See application file for complete search history.

(56) References Cited

U.S. PATENT DOCUMENTS

| | | | |
|---|---|---|---|
| 6,346,181 B1* | 2/2002 | Lee et al. | 205/89 |
| 6,500,568 B1* | 12/2002 | Robbins | 428/670 |
| 6,669,774 B1 | 12/2003 | Zhang et al. | |
| 2004/0033904 A1* | 2/2004 | Moore et al. | 505/100 |
| 2007/0179063 A1* | 8/2007 | Malozemoff et al. | 505/329 |
| 2008/0261072 A1 | 10/2008 | Kashima et al. | |
| 2009/0053550 A1* | 2/2009 | Kashima et al. | 428/601 |
| 2009/0069187 A1 | 3/2009 | Hasegawa et al. | |
| 2009/0286686 A1 | 11/2009 | Teranishi et al. | |

FOREIGN PATENT DOCUMENTS

| | | |
|---|---|---|
| JP | 2005-1935 | 1/2005 |
| JP | 2005-516882 | 6/2005 |
| JP | 2006-127847 | 5/2006 |
| JP | 2007-165153 | 6/2007 |
| JP | 2007-188756 | 7/2007 |
| JP | 2009-503794 | 1/2009 |
| JP | 2009-507358 | 2/2009 |
| JP | 2010-192349 | 9/2010 |
| WO | 03/067672 | 8/2003 |
| WO | 2007/016492 | 2/2007 |
| WO | 2008/036073 | 3/2008 |

OTHER PUBLICATIONS

Machine translation of JP 2006-127847, May 18, 2006.*
Final Decision for Rejection mailed Aug. 23, 2011 in corresponding Japanese Patent Application No. 163513/2009 filed Jul. 10, 2009, partial English translation thereof.
Office Action issued Mar. 20, 2015 in European Patent Application No. 10796995.8 (EP 2 453 446).

* cited by examiner

*Primary Examiner* — Paul Wartalowicz
(74) *Attorney, Agent, or Firm* — Drinker Biddle & Reath LLP

(57) ABSTRACT

The present invention relates to a method of producing a substrate, including the steps of preparing a substrate having a nickel layer formed on a copper layer through plating, subjecting the nickel layer to thermal treatment at 800-1000° C., and epitaxial-growing an intermediate layer on the nickel layer, after the step of subjecting the nickel layer to thermal treatment. According to the present invention, there can be provided a substrate that allows the orientation and flatness at the surface of a nickel layer to be improved, and a method of producing the substrate.

4 Claims, 1 Drawing Sheet

(a)
(b)
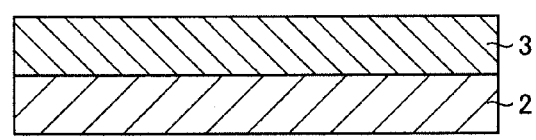
(c)
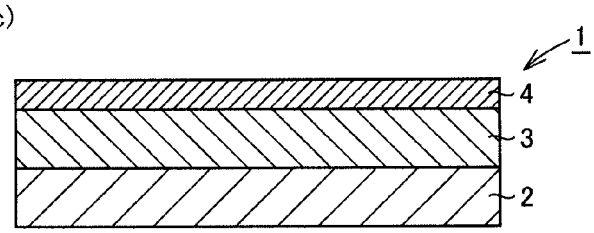
(d)
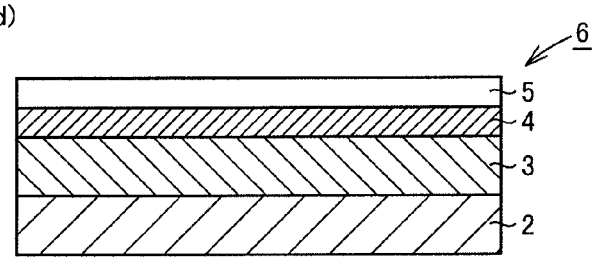

METHOD OF PRODUCING SUBSTRATE AND SUPERCONDUCTING WIRE

TECHNICAL FIELD

The present invention relates to a method of producing a substrate and a method of producing a superconducting wire.

BACKGROUND ART

Since the discovery of high-temperature superconductors, development in high-temperature superconducting wire is carried out actively in view of the application to power apparatus such as a cable, magnet, current-limiting device, and the like. The high-temperature superconducting wire is roughly classified into two types, i.e. a bismuth type silver sheath wire and a RE123 type thin film wire (RE=rare earth element).

As a general structure of a thin film superconducting wire, a thin intermediate layer of ceramic is formed on a metal substrate, and a superconducting layer is formed thereon. In order to draw out superior superconducting properties for a thin film superconducting wire, the crystal orientation of the superconducting layer must be arranged in three dimensions. To this end, a thin film having high orientation must be produced for the aforementioned thin film intermediate layer.

Japanese Patent Laying-Open No. 2005-1935 (Patent Literature 1) discloses a method including the steps of removing an oxide layer located on the surface of an oriented metal substrate, and epitaxial growth of a thin film such as an intermediate layer and a superconducting layer while maintaining the biaxial orientation of the oriented metal substrate.

CITATION LIST

Patent Literature

PTL 1: Japanese Patent Laying-Open No. 2005-1935

SUMMARY OF INVENTION

Technical Problem

In the case where an intermediate layer is formed directly on an oriented metal substrate, as in Patent Literature 1, there was a problem that oxidation of the oriented metal substrate could not be prevented sufficiently.

In view of this problem, the approach of forming a nickel plate layer on the metal substrate to prevent oxidation of the metal substrate is generally adopted.

However, in this case, there was a problem that the orientation is poor at the surface of the nickel plate layer formed on the metal substrate. Moreover, pits and the like are present at the surface of the nickel plate layer, leading to the problem of poor flatness.

An object of the present invention is to provide a method of producing a substrate and a method of producing a superconducting wire that allow improvement of the orientation and flatness at the surface of a nickel plate layer.

Solution to Problem

The present invention is directed to a method of producing a substrate, including the steps of preparing a substrate having a nickel layer formed on a copper layer through plating, subjecting the nickel layer to thermal treatment at 800-1000° C., and epitaxial-growing an intermediate layer on the nickel layer, after the step of subjecting the nickel layer to thermal treatment. By subjecting the nickel layer to heat treatment at 800 to 1000° C. according to a method of producing a substrate of the present invention, a substrate having the orientation and flatness improved at the surface of the nickel layer can be obtained. Furthermore, the diffusion of copper atoms from the copper layer as far as the surface of the nickel layer during thermal treatment can be suppressed.

In the method of producing a substrate according to the present invention, the step of subjecting the nickel layer to thermal treatment is preferably carried out under reducing atmosphere. By carrying out the step of subjecting the nickel layer to thermal treatment under reducing atmosphere, the oxide film formed at the surface of the nickel layer can be removed.

Preferably in the method of producing a substrate according to the present invention, the step of subjecting the nickel layer to thermal treatment is carried out under an atmosphere of gas containing hydrogen under reduced pressure. By carrying out the step of subjecting the nickel layer to thermal treatment under an atmosphere of gas containing hydrogen under reduced pressure, the oxide film formed at the surface of the nickel layer can be removed more effectively.

The present invention is directed to a method of producing a superconducting wire including the steps of preparing a substrate having a nickel layer formed on a copper layer through plating, subjecting the nickel layer to thermal treatment at 800 to 1000° C., epitaxial-growing an intermediate layer on the nickel layer after the step of subjecting the nickel layer to thermal treatment, and forming a superconducting layer on the intermediate layer. By subjecting the nickel layer to thermal treatment at 800-1000° C. according to a method of producing a superconducting wire of the present invention, a superconducting wire having the orientation and flatness of the superconducting layer improved can be obtained since a substrate having the orientation and flatness of the nickel layer surface improved is obtained.

Advantageous Effects of Invention

According to the present invention, there can be obtained a substrate having the orientation and flatness at the surface of a nickel layer improved, and a superconducting wire having the orientation and flatness of a superconducting wire improved.

BRIEF DESCRIPTION OF DRAWING

FIG. 1 is a schematic sectional view to describe a method of producing a substrate and superconducting wire according to an embodiment of the present invention.

DESCRIPTION OF EMBODIMENTS

Embodiments of the present invention will be described hereinafter based on the drawing. In the drawing, the same or corresponding elements have the same reference characters allotted, and description thereof will not be repeated.

FIG. 1 is a schematic sectional view to describe a method of producing a substrate 1 according to an embodiment of the present invention. Referring to FIG. 1, a method of producing a substrate 1 according to an embodiment of the present invention includes the steps of: preparing on a Cu layer 2 as shown in FIG. 1 (a), a substrate having an Ni layer 3 formed through plating as shown in FIG. 1 (b); subjecting the Ni layer 3 to thermal treatment at 800-1000° C.; and epitaxial-growing an intermediate layer 4 on Ni layer 3, as shown in FIG. 1 (c), after the step of subjecting Ni layer 3 to thermal treatment.

Step of Preparing Substrate

As shown in FIG. 1 (b), first a substrate having Ni layer 3 formed on Cu layer 2 through plating is prepared.

Cu layer 2 is suitable for an oriented substrate since Cu atoms are in biaxial orientation. A "biaxial orientation" includes, not only a complete biaxial orientation, but also the case where the angle of deviation of the crystal axis is less than or equal to 25°. Moreover, the orientation direction preferably corresponds to the case where the <100> axis is in a direction perpendicular to the substrate face and the <010> axis is in the direction of the length of the substrate.

Cu layer 2 can also be stacked on another metal or alloy. For example, Cu layer 2 can be provided on stainless steel that is a material of high strength (hereinafter, also referred to as SUS).

Cu layer 2 may take the shape of a relatively lengthy tape.

An Ni layer 3 is formed on Cu layer 2 through plating. The plating method includes electrolytic plating, non-electrolytic plating, and the like. Particularly, electrolytic plating is preferable from the standpoint of continuous processing with favorable efficiency. Ni layer 3 serves to prevent oxidation during the formation of intermediate layer 4. In the case where Cu layer 2 is oriented, Ni layer 3 formed thereon is also oriented.

The thickness of Ni layer 3 is preferably 1-10 μm, more preferably 1-3 μm. In the case where the thickness is greater than or equal to 1 μm, diffusion of Cu atoms to the surface of the Ni layer can be suppressed even if heat of approximately 800-1000° C. is applied in the thermal treatment of Ni layer 3 that will be described afterwards. Therefore, the function of Ni layer 3, not readily oxidized, and having a favorable matching lattice with intermediate layer 4, can be exhibited effectively. The thickness of Ni layer 3 preferably does not exceed 10 μm since the orientation in the epitaxial-growth of Ni layer 3 will be greatly disturbed.

Step of Thermal Treatment

Then, Ni layer 3 is subjected to thermal treatment. By this step, the orientation and flatness of Ni layer 3 are improved.

The step of subjecting Ni layer 3 to thermal treatment is preferably carried out under reducing atmosphere. Thermal treatment under reducing atmosphere refers to thermal treatment carried out under reducing atmosphere sufficient to remove an oxide layer formed at the surface of the oriented metal substrate. A reducing atmosphere implies that a reducing gas such as hydrogen ($H_2$) gas, for example, is present under reduced pressure. Reduced pressure is of a level lower than the atmospheric pressure, preferably 1-10 Pa, for example. A higher mole % of the $H_2$ gas in the atmosphere gas during thermal treatment is preferable since the reducing property becomes higher. In the case where $H_2$ gas is used together with Ar gas, for example, as the reducing gas, the mole % of the $H_2$ gas is preferably greater than or equal to 1, more preferably greater than or equal to 3.

The thermal treatment temperature on Ni layer 3 is preferably 800-1000° C. A thermal treatment temperature lower than 800° C. is insufficient for improving the orientation and flatness of Ni layer 3. If the temperature exceeds 1000° C., Ni and Cu will diffuse to be completely alloyed, causing Cu diffusion at the surface of the Ni layer. Since Cu is readily oxidized, the orientation and flatness cannot be improved at the surface of Ni layer 3.

The duration of thermal treatment on Ni layer 3 is preferably, but not particularly limited to, 15 minutes or more. If the duration of thermal treatment is less than 15 minutes, the orientation and flatness of Ni layer 3 cannot be improved sufficiently.

<Epitaxial-Growth Step>

As shown in FIG. 1 (c), intermediate layer 4 is epitaxial-grown on Ni layer 3 subjected to thermal treatment to obtain substrate 1. For intermediate layer 4, a metal oxide having at least one type of metal element with a crystal structure of the pyrochlore, fluorite, rock salt or perovskite type is adopted. Specifically, rare earth element oxide such as $CeO_2$, YSZ (Yttria Stabilized Zirconia), BZO ($BaZrO_3$), STO ($SrTiO_3$), $Al_2O_3$, $YAlO_3$, MgO, Ln-M-O based compound (Ln is one or more type of lanthanoid element, M is one or more type of element selected from Sr, Zr and Ga, and O is oxygen) can be cited. Such oxide serves to alleviate the difference in the crystal constant and crystal orientation between Cu layer 2 that is the oriented metal substrate and superconducting layer 5 formed on intermediate layer 4, and prevents the flow out of metal atoms from Cu layer 2 towards the superconducting layer. The method of forming a thin film oxide qualified as intermediate layer 4 is not particularly limited as long as the object of the present invention is not impaired. Sputtering, EBD (Electron Beam Deposition), PLD (Pulse Laser Deposition), thermal deposition or the like can be preferably adopted.

For example, by epitaxial-growing a $CeO_2$ thin film as intermediate layer 4 on biaxial oriented Ni layer 3 having the <100> axis in a direction perpendicular to the substrate face and the <010> axis in the length direction of the substrate after the thermal treatment, a $CeO_2$ thin film having the <100> axis oriented perpendicular to the substrate face and the <011> axis oriented in the length direction of the substrate is formed. Thus, a $CeO_2$ thin film having high biaxial orientation can be obtained.

<Formation of Superconducting Layer>

In the case where superconducting layer 5 is formed on intermediate layer 4 of the obtained substrate 1, superconducting layer 5 of high biaxial orientation can be obtained since the orientation and flatness of intermediate layer 4 are favorable.

Superconducting layer 5 has the shape of a relatively lengthy tape. Superconducting layer 5 is a superconductor or the like represented by $REBa_2Cu_3O_y$, is 6-8, more preferably substantially 7; RE implies a rare earth element such as Y (yttrium), or Gd (gadolinium), Sm (samarium), Ho (holmium)). Preferably, superconducting layer 5 is formed of GdBCO, for example. GdBCO is represented as $GdBa_2Cu_3O_y$, (y is 6-8, more preferably substantially 7). The method of forming a thin oxide film that will become superconducting layer 5 is not particularly limited as long as the object of the present invention is not impaired. Preferably, the PLD method, MOD (Metal Organic Deposition), MOCVD (Metal Organic Chemical Vapor Deposition), and the like can be adopted.

Furthermore, for the purpose of protecting superconducting layer 5, a protection layer (not shown) can be formed on superconducting layer 5, as necessary. The protection layer is not particularly limited as long as it has high conductivity. Preferably, Ag, Au, Pt, Al, or an alloy thereof is adopted. The method of forming a protection layer preferably includes, but not particularly limited to, sputtering, EBD, PLD, thermal deposition, MOD, MOCVD, plating, and the like.

EXAMPLES

Examples 1-4

First, a substrate having an 18 μm-thick Cu layer on a SUS substrate was prepared. The substrate including the Cu layer was subjected to electrolytic nickel plating to form an Ni layer having a thickness shown in Table 1.

Then, the aforementioned Ni layer was subjected to thermal treatment for 16 minutes using mixture gas of $H_2$ gas and Ar gas as the reducing gas (composition: 3 mole % of $H_2$ gas; 97 mole % of Ar gas) under the atmosphere of 8.1 Pa in pressure at the thermal treatment temperature shown in Table 1. Immediately thereafter, sputtering was carried out using a mixture of $H_2$ gas and Ar gas as the reducing gas (composition: 3 mole % of $H_2$ gas, 97 mole % of Ar gas) under the atmosphere of 5.2 Pa in pressure and at the substrate temperature of 700° C. to form on the nickel layer a $CeO_2$ thin film to a thickness of 0.15 μm as the first intermediate layer. On that $CeO_2$ thin film, a YSZ thin film was formed to a thickness of 0.25 μm as the second intermediate layer to prevent element diffusion. Further, as the third intermediate layer, a $CeO_2$ thin film was formed to a thickness of 0.05 μm for lattice matching with the superconducting film.

Then, on the intermediate layer formed of the three layers set forth above, a GdBCO film was formed as the superconducting layer by PLD.

Comparative Examples 1-2

Three layers constituting an intermediate layer and a superconducting layer were formed in a manner similar to those of Examples 1-4 set forth above, provided that the Ni layer was not subjected to thermal treatment.

Comparative Examples 3-4

Three layers constituting an intermediate layer and a superconducting layer were formed in a manner similar to those of Examples 1-4 set forth above.

(Measurement Method)

For the obtained substrates, the biaxial orientation, the surface roughness (Ra) and the Ni—Cu diffusion of the $CeO_2$ thin film that is the first intermediate layer were measured. Furthermore, the critical current value Ic was measured for the obtained superconducting wire.

With regard to the biaxial orientation of the $CeO_2$ thin film that is the first intermediate layer, the X-ray diffraction peak intensity from the (200) plane and (111) plane of the $CeO_2$ thin film (I (200) and I (111)) was measured. The biaxial orientation of the $CeO_2$ thin film was evaluated by the numeric value of (I (200)/(I (200)+I (111)). A higher numeric value implies a higher biaxial orientation of the $CeO_2$ thin film that is the first intermediate layer, and is preferable. The X-ray diffraction peak intensity from the (200) plane represents the amount of crystals biaxially oriented in the direction where the <100> axis is perpendicular to the substrate face, and the <011> axis is in the direction of the length of the substrate face. The X-ray diffraction peak intensity from the (111) plane represents the amount of crystals uniaxially oriented in the direction where the <111> axis is perpendicular to the substrate face.

The surface roughness (Ra) refers to the arithmetic mean roughness Ra defined by JIS B 0601 as follows. Just the reference length is extracted from the roughness curve in the mean line direction. The distance from the mean line of the extracted portion up to the curve of measurement (absolute values of deviation) is added and averaged out to be defined as the surface roughness. Surface roughness Ra was measured in the range of 10 μm square using an atomic force microscope (AFM).

With regard to Ni—Cu diffusion: (A) the 2θ(°) of the (200) plane of the copper layer (Cu (200) plane); and (B) the 2θ(°) of the (200) plane of the Ni layer (Ni (200) plane) each were measured by XRD, and evaluated by the numeric value of (B)-(A). A smaller numeric value indicates that alloying of Ni and Cu layer has advanced. The numeric value of 0 implies complete alloying.

For critical current value Ic, measurement was carried out in its self magnetic field at the temperature of 77K, corresponding to the conducting current value when an electric field of $10^{-6}$V/cm was generated.

The results are shown in Table 1.

TABLE 1

| | | Comparative Example 1 | Comparative Example 2 | Comparative Example 3 | Comparative Example 4 | Example 1 | Example 2 | Example 3 | Example 4 |
|---|---|---|---|---|---|---|---|---|---|
| Thermal Treatment Temperature | | Not Treated | Not Treated | >1000° C. | >1000° C. | 850-900° C. | 850-900° C. | 900-950° C. | 900-950° C. |
| Ni Layer Thickness | | 1 μm | 2.4 μm | 1 μm | 2.4 μm | 1 μm | 2.4 μm | 1 μm | 2.4 μm |
| Biaxial Orientation of $CeO_2$ Thin Film (I(200)/I(200) + I(111)) × 100) | | 0% | 0% | 0% | 0% | 80% | 40% | 90% | 90% |
| Surface Roughness (Ra) | | 30 nm | 30 nm | — | — | 10 nm | 13 nm | 8 nm | 8 nm |
| Ni—Cu Diffusion | (A) 2θ of Cu (200) | 50.4° | 50.4° | 50.7° | 50.7° | 50.4° | 50.4° | 50.7° | 50.4° |
| | (B) 2θ of Ni (200) | 51.8° | 51.8° | 50.7° | 50.7° | 51.1° | 51.6° | 50.9° | 51.6° |
| | (B) − (A) | 1.4° | 1.4° | 0° | 0° | 0.7° | 1.2° | 0.2° | 1.2° |
| Critical Current Value (Ic) | | 0 A/cm | 0 A/cm | 0 A/cm | 0 A/cm | 200 A/cm | 100 A/cm | 250 A/cm | 250 A/cm |

(Measurement Results)

Examples 1-4 correspond to substrates having the Ni layer subjected to thermal treatment at a temperature in the range of 850-950° C. The biaxial orientation of the $CeO_2$ thin film that is the first intermediate layer could be improved, as compared to Comparative Examples 1 and 2 not having the Ni layer subjected to thermal treatment. To improve the biaxial orientation of the $CeO_2$ thin film that is the first intermediate layer, a higher temperature for thermal treatment was required as a function of a thicker Ni layer. Moreover, the surface roughness could be reduced, as compared to Comparative Examples 1 and 2 not having the Ni layer subjected to thermal treatment, leading to improved surface flatness. The Cu and Ni were alloyed only partially, and Cu did not diffuse to the surface of the Ni layer.

In Comparative Examples 3 and 4, the Cu and Ni were completely alloyed since the Ni layer was subjected to thermal treatment at a temperature exceeding 1000° C. Cu was diffused to the surface of the Ni layer. Therefore, it was difficult to sufficiently improve the biaxial orientation of the $CeO_2$ thin film that is the first intermediate layer.

It is to be understood that the embodiments and examples disclosed herein are only by way of example, and not to be taken by way of limitation. The scope of the present invention is not limited by the description above, but rather by the terms of the appended claims, and is intended to include any modifications within the scope and meaning equivalent to the terms of the claims.

REFERENCE SIGNS LIST

1 substrate; 2 Cu layer; 3 Ni layer; 4 intermediate layer; 5 superconducting layer; 6 superconducting wire.

The invention claimed is:

1. A method of producing a substrate comprising the steps of:
   preparing a substrate having a nickel layer of 1-10 μm in thickness formed on a copper layer through plating,
   subjecting said nickel layer that is not covered by another layer to thermal treatment at 800-1000° C. and stopping thermal treatment before Cu diffuses to the surface of the nickel layer, and
   epitaxial-growing an intermediate layer directly onto said nickel layer, after the step of subjecting said nickel layer to thermal treatment.

2. The method of producing a substrate according to claim 1, wherein the step of subjecting said nickel layer to thermal treatment is carried out under reducing atmosphere.

3. The method of producing a substrate according to claim 1, wherein the step of subjecting said nickel layer to thermal treatment is carried out under an atmosphere of gas containing hydrogen under reduced pressure.

4. A method of producing a superconducting wire comprising the steps of:
   preparing a substrate having a nickel layer of 1-10 μm in thickness formed on a copper layer through plating,
   subjecting said nickel layer that is not covered by another layer to thermal treatment at 800-1000° C. and stopping thermal treatment before Cu diffuses to the surface of the nickel layer,
   epitaxial-growing an intermediate layer directly onto said nickel layer, after the step of subjecting said nickel layer to thermal treatment, and
   forming a superconducting layer on said intermediate layer.

* * * * *